United States Patent
Du et al.

(10) Patent No.: US 10,193,506 B2
(45) Date of Patent: Jan. 29, 2019

(54) METHODS AND CIRCUITS TO REDUCE POP NOISE IN AN AUDIO DEVICE

(71) Applicant: STMicroelectronics (Shenzhen) R&D Co. Ltd, Shenzhen (CN)

(72) Inventors: Ru Feng Du, Shenzhen (CN); Qi Yu Liu, Shenzhen (CN)

(73) Assignee: STMicroelectronics (Shenzhen) R&D Co. Ltd, Shenzhen (CN)

(*) Notice: Subject to any disclaimer, the term of this patent is extended or adjusted under 35 U.S.C. 154(b) by 0 days.

(21) Appl. No.: 15/377,929

(22) Filed: Dec. 13, 2016

(65) Prior Publication Data

US 2017/0093348 A1    Mar. 30, 2017

Related U.S. Application Data

(63) Continuation of application No. 15/057,552, filed on Mar. 1, 2016, now Pat. No. 9,577,579, which is a (Continued)

(30) Foreign Application Priority Data

Sep. 12, 2013   (CN) .......................... 2013 1 0422290

(51) Int. Cl.
*H03F 1/32* (2006.01)
*H03G 3/34* (2006.01)
(Continued)

(52) U.S. Cl.
CPC ......... *H03F 1/3205* (2013.01); *H03F 1/0205* (2013.01); *H03F 1/305* (2013.01);
(Continued)

(58) Field of Classification Search
USPC ................................ 330/251–261, 207 A, 10
See application file for complete search history.

(56) References Cited

U.S. PATENT DOCUMENTS

| 5,208,865 A | 5/1993 | Friske et al. |
| 5,363,384 A | 11/1994 | Miyoshi et al. |
| (Continued) |

FOREIGN PATENT DOCUMENTS

| CN | 101345513 A | 1/2009 |
| CN | 101924969 A | 12/2010 |

OTHER PUBLICATIONS

CN First Office Action and Search Report for co-pending CN Appl. No. 201310422290.4 dated Dec. 1, 2016 (21 pages).

*Primary Examiner* — Hieu Nguyen
(74) *Attorney, Agent, or Firm* — Crowe & Dunlevy

(57) ABSTRACT

A class D amplifier receives and amplifies a differential analog signal which is then differentially integrated. Two pulse width modulators generate pulse signals corresponding to the differentially integrated analog signal and two power units generate output pulse signals. The outputs the power units are coupled to input terminals of integrators via a resistor feedback network. An analog output unit converts the pulse signals to an output analog signal. The differential integration circuitry implements a soft transition between mute/un-mute. In mute, the integrator output is fixed. During the soft transition, the PWM outputs change slowly from a fixed 50% duty cycle to a final value to ensure that no pop noise is present in the output as a result of mode change.

31 Claims, 5 Drawing Sheets

Related U.S. Application Data continuation of application No. 14/478,531, filed on Sep. 5, 2014, now Pat. No. 9,306,523.

(51) Int. Cl.

| | | |
|---|---|---|
| *H03F 3/45* | (2006.01) | |
| *H03F 3/187* | (2006.01) | |
| *H03F 3/217* | (2006.01) | |
| *H03F 1/02* | (2006.01) | |
| *H04R 3/00* | (2006.01) | |
| *H03F 1/30* | (2006.01) | |
| *H03F 3/183* | (2006.01) | |
| *H03F 3/185* | (2006.01) | |
| *H03F 3/21* | (2006.01) | |

(52) U.S. Cl.
CPC ............ *H03F 3/183* (2013.01); *H03F 3/185* (2013.01); *H03F 3/187* (2013.01); *H03F 3/211* (2013.01); *H03F 3/2171* (2013.01); *H03F 3/2173* (2013.01); *H03F 3/45179* (2013.01); *H03G 3/345* (2013.01); *H03G 3/348* (2013.01); *H04R 3/002* (2013.01); *H03F 2200/03* (2013.01); *H03F 2200/351* (2013.01); *H03F 2203/21106* (2013.01); *H03F 2203/45151* (2013.01); *H03F 2203/45156* (2013.01)

(56) References Cited

U.S. PATENT DOCUMENTS

| | | |
|---|---|---|
| 5,450,622 A | 9/1995 | Vandegraaf |
| 5,805,020 A | 9/1998 | Danz et al. |
| 6,118,336 A | 9/2000 | Pullen et al. |
| 7,375,585 B2* | 5/2008 | Trifonov ............ H03F 3/45219 330/258 |
| 7,532,072 B1* | 5/2009 | Tavakoli Dastjerdi ...................... H03F 1/3211 330/258 |
| 8,265,303 B2 | 9/2012 | Zhang et al. |
| 2005/0083115 A1 | 4/2005 | Risbo |
| 2006/0147062 A1 | 7/2006 | Niwa et al. |
| 2014/0369529 A1 | 12/2014 | Quinn |
| 2015/0071464 A1 | 3/2015 | Du et al. |

* cited by examiner ately larger than 20 mV) produces an audible pop noise at transient events where the output stage starts to switch on or switch off. If a large audio signal starts from a silent environment or a large audio signal stops suddenly, the resulting pop noise is uncomfortable for the listener. This event is one kind of pop noise.

METHODS AND CIRCUITS TO REDUCE POP NOISE IN AN AUDIO DEVICE

CROSS-REFERENCE TO RELATED APPLICATIONS

This application is a continuation of U.S. Application for patent Ser. No. 15/057,552 filed Mar. 1, 2016, which is a continuation of U.S. Application for patent Ser. No. 14/478, 531 filed Sep. 5, 2014 (now U.S. Pat. No. 9,306,523), which claims priority from Chinese Application for Patent No. 201310422290.4 filed Sep. 12, 2013, the disclosures of which are all incorporated by reference.

TECHNICAL FIELD

The present disclosure relates generally to an integrated circuit, more particularly, to methods and circuits to reduce pop noise in an audio device.

BACKGROUND

As class AB amplifiers have good audio performance and they are widely used in audio devices. However, the power consumption of class AB amplifiers is so large that they may not be used in portable devices which are powered by batteries.

Class D amplifiers are another type amplifier which have good audio performance and consume less power. In operation, class D amplifiers convert an analog signal to a digital signal (e.g., pulses) and then convert the digital signal back into an amplified analog signal. In the process of this signal conversion, many kinds of disturbances may affect the output amplified analog signal from class D amplifiers, and these disturbances may make the audio uncomfortable for the listener.

During the operation of class D amplifiers, audible pop noises are generated in response to transient events. If a large sound signal starts/finishes suddenly or the audio device including the class D amplifier stops/starts suddenly, a pop noise is generated in correlation with these events and such pop noise is easily heard by the listener.

Because of the steps of fabrication process, both offset of input stages of the class D amplifiers and mismatching of resistors in the feedback loop may contribute to offset in output. Without any suppression, this offset (especially when this offset is larger than 20 mV) produces an audible pop noise at transient events where the output stage starts to switch on or switch off. If a large audio signal starts from a silent environment or a large audio signal stops suddenly, the resulting pop noise is uncomfortable for the listener. This event is one kind of pop noise.

SUMMARY

Thus, there is a need in the art for a class D amplifier which can reduce pop noise caused by offset or a sudden start or finish of a large audio signal.

In an embodiment, a circuit comprises: an integrating circuit configured to integrate an analog signal, wherein the integrating circuit comprises: a first amplifier circuit biased by a first bias current and configured to receive and integrate said analog signal; a second amplifier circuit biased by a second bias current and configured to generate a reference voltage; a third amplifier circuit operating response to a enable signal to generate differential first and second control signals; a first bias circuit configured to generate the first bias current in response to the first control signal; and a second bias circuit configured to generate the second bias current in response to the second control signal.

In an embodiment, a circuit comprises: an integrating amplifier circuit having an input configured to receive an analog signal and generate an integrated analog signal at an output coupled to an output node; a voltage regulator circuit configured to generate a regulated voltage at an output coupled to the output node; a control module coupled to the integrating amplifier circuit and the voltage regulator circuit and configured to control operations of the integrating amplifier circuit and the voltage regulator circuit in response to a mode switch signal; said control module responding to a change in logic state of the mode switch signal by gradually disabling the integrating amplifier circuit and simultaneously gradually enabling the voltage regulator circuit so as to gradually convert the output node from the integrated analog signal to the regulated voltage.

In an embodiment, a circuit comprises: an integrating amplifier circuit having an input configured to receive an analog signal and generate an integrated analog signal at an output coupled to an output node; a voltage regulator circuit configured to generate a regulated voltage at an output coupled to the output node; a control module coupled to the integrating amplifier circuit and the voltage regulator circuit and configured to control operations of the integrating amplifier circuit and the voltage regulator circuit in response to a mode switch signal; said control module responding to a change in logic state of the mode switch signal by gradually enabling the integrating amplifier circuit and simultaneously gradually disabling the voltage regulator circuit so as to gradually convert the output node from the regulated voltage to the integrated analog signal.

In an embodiment, a circuit comprises: an amplifier circuit having an input configured to receive an analog signal and an output configured to generate an output analog signal; a regulator circuit having an output configured to generate a reference signal; an output node coupled to the outputs of the amplifier circuit and regulator circuit; a control module coupled to the amplifier circuit and the regulator circuit and configured to control operations of the amplifier circuit and the regulator circuit based on a mode switch signal; said control module responding to a change in state of the mode switch signal by gradually disabling one of the amplifier circuit or regulator circuit and simultaneously gradually enabling the other one of the amplifier circuit or regulator circuit.

The foregoing has outlined, rather broadly, features of the present invention. Additional features of the invention may be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DETAILED DESCRIPTION

Although the following describes example methods and circuits, it should be noted that these examples are merely illustrative and should not be considered as limiting. Accordingly, while the following describes example methods and circuits, persons of ordinary skill in the art may readily appreciate that the examples provided are not the only way to implement such methods and circuits.

Figure 1:
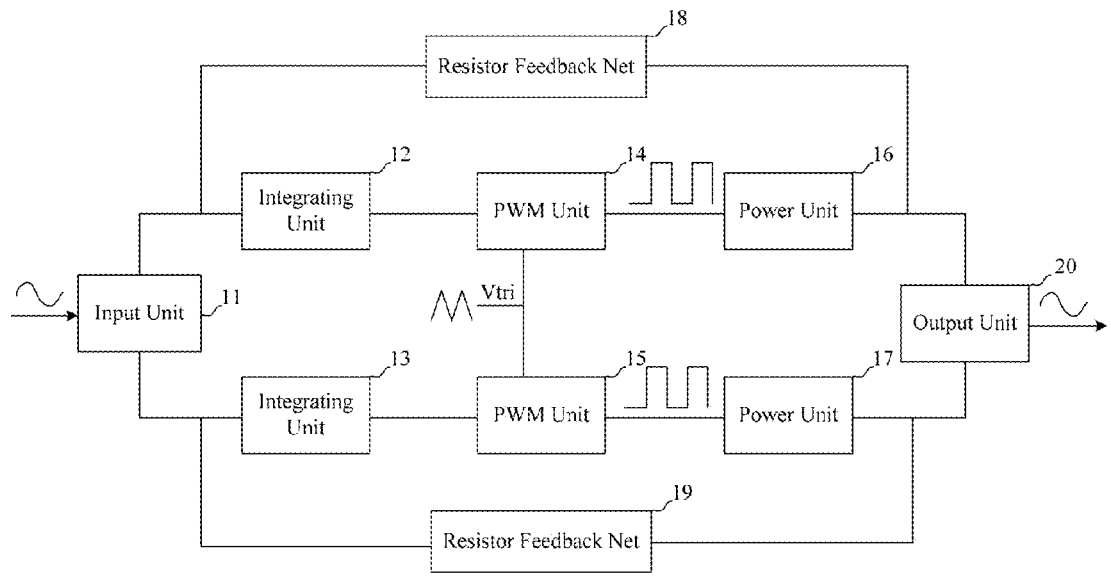
FIG. 1 represents an architecture of a BTL (bridge tied-load) class D Amplifier.

FIG. 1 represents an architecture of a BTL class D Amplifier, including an audio signal input unit 11, integrating units 12 and 13, pulse width modulation (PWM) units 14 and 15, power units 16 and 17, resistor feedback nets 18 and 19, and an audio signal output unit 20. The audio signal input unit 11, integrating units 12 and 13, and pulse width modulation (PWM) units 14 and 15 are powered from a power line VDD (3.3V for example). The power units 16 and 17 and the output unit 20 are powered from a higher voltage power line VCC (5V to 36V for example).

Input unit 11 has outputs coupled to integrating units 12 and 13 respectively, and has an input configured to receive an analog audio signal. Generally, the input unit 11 transmits the received analog audio signal to the integrating units 12 and 13 in a differential pattern. After being integrated in integrating units 12 and 13, the integrated audio signal is out to PWM units 14 and 15 which each operate to compare the integrated audio signal with a triangle signal Vtri to generate pulse signals with different pulse width which are used to drive the power units 16 and 17. So, the work status of power units 16 and 17 is determined by the pulse signals. The outputs of the power units 16 and 17 are further coupled to the integrating units 12 and 13 respectively via resistor feedback nets 18 and 19. The class D amplifier accordingly works in a closed loop, which may improve the performance of the class D amplifier with respect to, for example, Total Harmonic Distortion (THD), Power Supply Rejection Ratio (PSRR) and stability. The class D amplifier also includes an output unit 20 which may convert the pulse signals output from the power units 16 and 17 into an analog output signal for output to a speaker.

In operation, there are two working modes of the class D amplifier, a mute mode and an un-mute mode. The output unit 20 may not output any audio signal in the mute mode, because the duty cycle of the pulse signals generated by PWM units 14 and 15 are set to be 50%. In the un-mute mode, however, PWM units 14 and 15 may output two pulse signals with different pulse widths to the power unit 16 and 17 which increase the power of the pulse signals. The output unit 20 receives the increase power pulse signals and outputs the audio signal.

Figure 2:
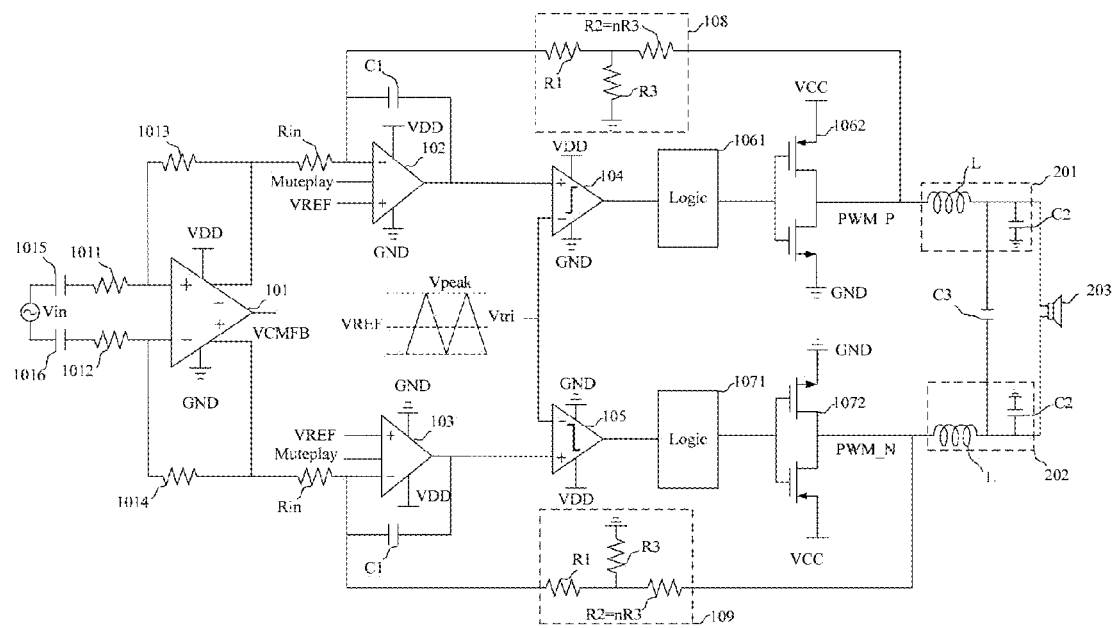
FIG. 2 is a schematic of a BTL output class D amplifier in FIG. 1.

FIG. 2 is a schematic diagram of a BTL output class D amplifier in FIG. 1. The BTL output class D amplifier has two branches which are the same as each other. A fully differential pre-amplifier 101, which includes four gain setting resistors 1011 to 1014 and two DC blocking capacitors 1015 and 1016, is employed as the input unit 11 of FIG. 1. Integrators 102 and 103 are coupled to differential outputs of the pre-amplifier 101, respectively, and are configured to integrate the differential pre-amplified analog audio signals output by pre-amplifier 101. Comparators 104 and 105 coupled to the outputs of the integrators 102 and 103, respectively, are configured to receive the differential integrated audio signals. The power supply of the fully differential pre-amplifier, the integrators and the comparators is a low level voltage VDD (e.g., 2.7V~5V). Compared to VDD, the power unit 16, which includes logic unit 1061 and power amplifier 1062, and the power unit 17, which includes logic unit 1071 and power amplifier 1072, comprises power DMOS transistors and works at a higher level voltage VCC (e.g. 5V~36V). Output unit 20 includes LC low-pass filters 201 and 202 having outputs coupled to a speaker 203 with capacitor C3 coupled in parallel to the speaker 203. The LC low-pass filters 201 and 202 are configured to convert received pulse signals into analog signals.

In operation, the fully differential pre-amplifier 101 receives an analog audio signal and transmits the differential analog signals amplified by the pre-amplifier 101 to inputs of the integrators 102 and 103. The integrators 102 and 103 then integrate the amplified differential analog signals and transmit integrated analog signals to the inputs of comparators 104 and 105 which compare the integrated amplifier differential analog signals with a common triangle signal Vtri to modulate the integrated analog signals to pulse signals with different pulse width. Logic units 1601 and 1071 are used to shift the output voltage of comparators 104 and 105 from VDD to VCC so that the power amplifiers 1062 and 1072 can be driven by the modulated pulse signals. The low-pass filters 201 and 202 receive pulse signals generated by the power amplifiers 1062 and 1072 and convert the received pulse signals into analog signals which drive the speaker 203.

The output terminals of power amplifiers 1062 and 1072 are further coupled to inputs of the integrators 102 and 103 via the resistor feedback nets 108 and 109, respectively, so that the class D amplifier can operate in a closed loop. In FIG. 2, R2 is n times the resistance of resistor R3.

To fix the PWM outputs of the two branches in a BTL at 50% duty cycle in the mute mode, two voltage references (VR1 and VCMFB) are generated internally. VR1 is equal to half of VDD, and is employed as a voltage reference VREF for integrators 102 and 103. The triangle signal is also biased by VR1, which means intermediate level of the triangle signal is determined by VR1. In this embodiment, the intermediate level of the triangle signal is equal to VR1=VREF. VCMFB is a voltage reference for pre-amplifier 101. When there is no analog signal input into pre-amplifier 101, the PWM output is biased at VCC/2, which is the requirement for DC balance.

According to the Kirchhoff's law, the average output of the power amplifiers $V_{OUT}$ is given by:

$$V_{OUT} = N \cdot VR1 \cdot \left[1 + \frac{n+1}{N}\right] - N \cdot VCMFB \quad (1)$$

$$n = \frac{R2}{R3} \quad (2)$$

$$N = \frac{Rfb}{Rin} \quad (3)$$

$R_{fb}$ 108 may be a resistor net which comprises resistors R1 to R3, and can be expressed as below:

$$R_{fb} = (n+1) \cdot R1 + n \cdot R3 \quad (4)$$

In another embodiment, the number of resistors of the resistor net may be at least one. In order to set $V_{OUT}$ at VCC/2 with zero input signal, the internal voltage reference VR1 and VCMFB are designed to be:

$$VR1 = \frac{1}{2}VDD \quad (5)$$

$$VCMFB = VDD \cdot \left[\frac{1}{2} + \frac{n+1}{2N}\right] - \frac{1}{2N}VCC \quad (6)$$

Figure 3:
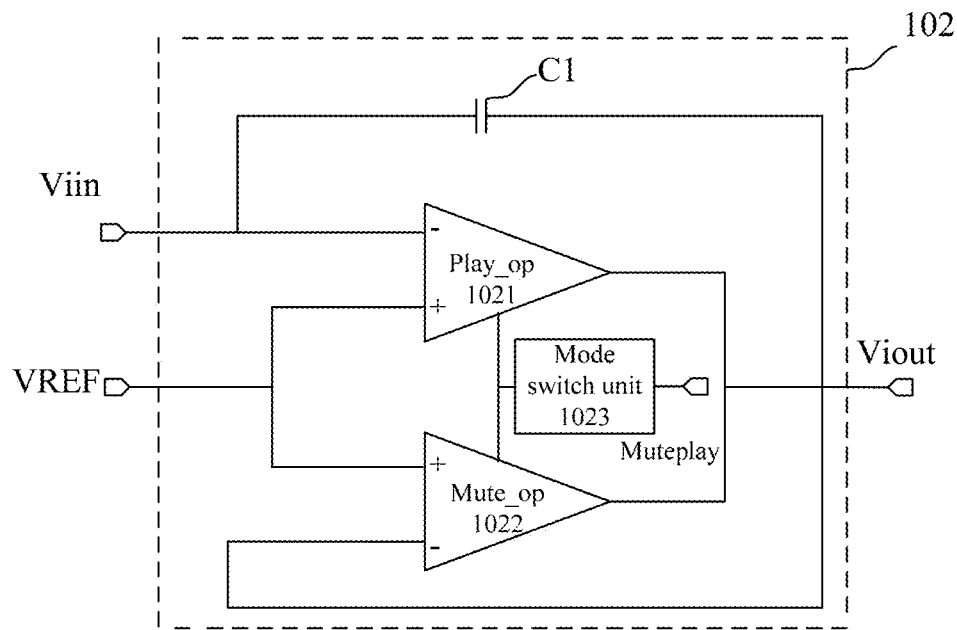
FIG. 3 is a block diagram of an integrator in accordance with one embodiment.

FIG. 3 is a block diagram of an integrator (reference 12 or 13) in accordance with one embodiment. The integrator 102 (or 103) has three input terminals, including terminals VREF, Muteplay and Viin. The terminal VREF is configured to receive the voltage reference VREF, the terminal Muteplay is used to receive a mode switch signal, and the terminal Viin is configured to receive the signal output from pre-amplifier 101 and/or power amplifier 1062/1072.

The integrator 102/103 comprises two operational amplifiers (opamp): Mute_op 1022 works in the mute mode, and Play_op 1021 works in the un-mute mode. Both the positive terminals of the two opamps are coupled to the terminal VREF to share a common voltage reference. The negative terminal Viin of Play_op 1021 is coupled to the output terminal Viout of the integrator 102/103 via an integrating capacitor C1, and is configured to receive the analog signal output by pre-amplifier 101. The negative terminal of Mute_op 1022 is coupled to the output terminal Viout of integrator 102. The integrator 102 further comprises a Mode_switch unit 1023 which has a terminal Muteplay to receive a mode switch signal which can achieve a soft transition between mute and un-mute mode.

In operation, while the Muteplay terminal receives a mode switch signal that switches on Mute_op 1022 and switches off Play_op 1021, the Mode_switch unit 1023 may enable the Mute_op 1022 and disable the Play_op 1021. Then, the output at the terminal Viout is set to be equal to the signal at terminal VREF. In this embodiment, the integrator output is equal to VR1. When the voltage at the terminal Viout is limited to VR1, the closed loop of the Class D amplifier is cut off. Even if there is an audio signal from pre-amplifier 101 input into the integrator 102, the power amplifier 1602 and 1702 may maintain the output pulse signals having a 50% duty cycle. So, the offset caused by pre-amplifier 101 and mismatching of resistors in feedback loop are cancelled, and only the offset of the buffer opamp (Mute_op 1022) is transferred to the output of the class D amplifier. This offset is, however, very small, and no audible pop noise is generated.

In the un-mute mode, the Play_op 1021 works and Mute_op 1022 is disabled. The integrator 102/103 outputs an integrated audio signal, and corrects the PWM output through the closed loop.

Figure 4A:
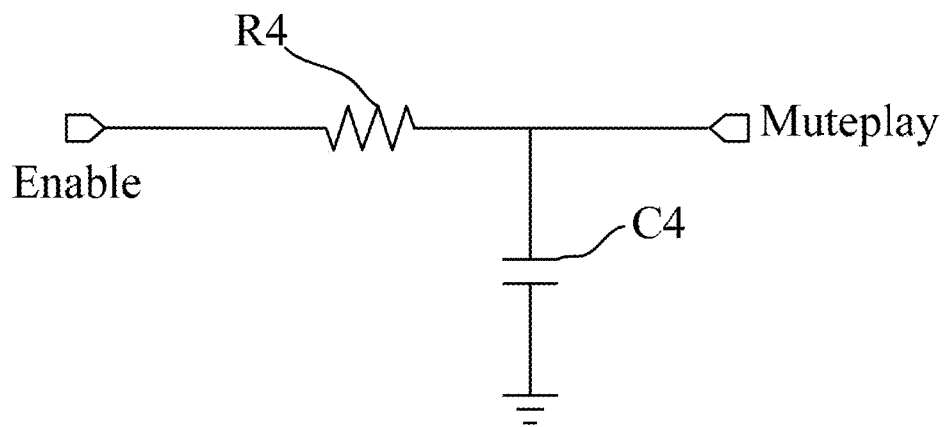
FIG. 4A shows a detailed schematic of a signal generator used to control the integrator.
Figure 4B:
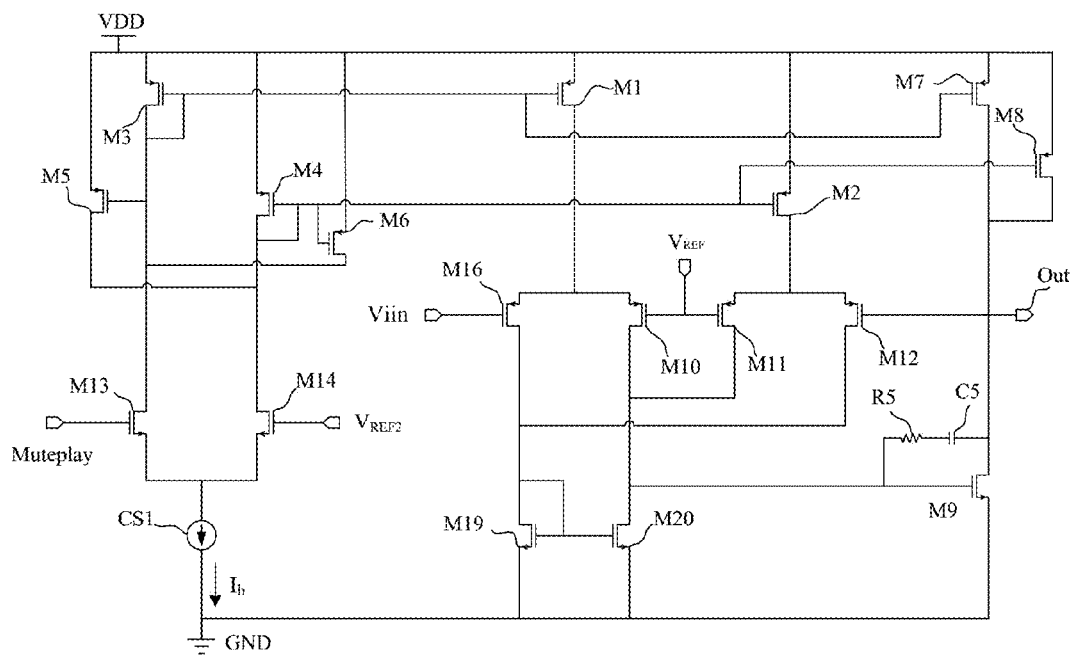
FIG. 4B shows a detailed schematic of the integrator in accordance with one embodiment.

FIG. 4A shows a detailed schematic of a signal generator used to control the integrator, and FIG. 4B shows a detailed schematic of the integrator in accordance with one embodiment.

Essentially, the mode switch signal is a signal that is used to enable/disable a corresponding opamp. In the embodiment, the mode switch signal is converted from a pulse signal to a ramp signal which has a specified slope and is generated by an RC net shown in FIG. 4A.

The terminal Enable is coupled to terminal Muteplay via a resistor R4, and the terminal Muteplay is coupled to ground through a capacitor C4. When the terminal Enable receives a mode switch signal that is a pulse signal, the RC net will convert the pulse signal into a ramp signal with a slope determined by the capacitance of capacitor C4.

In FIG. 4B, there are three opamps: the Play_op 1021, the Mute_op 1022 and the Mode Switch unit 1023. In this embodiment, both the Play_op 1021 and the Mute-op 1022 are two-stage amplifiers which share a common load of the first stage that includes NMOS transistors M19 and M20. Alternatively, the Play_op 1021 and the Mute-op 1022 may have independent load stages which may supply same or different impedances.

In Mode switch unit 1023, NMOS transistors M13 and M14 form a differential pair, with the gate of NMOS transistor M13 coupled to the terminal Muteplay to receive the Mode switch signal, and the gate of NMOS transistor M14 coupled to internal terminal VREF2 to receive a voltage reference VR2. Both the drain and gate of NMOS transistor M3 are coupled together to the gates of PMOS transistors M1 and M7. So, PMOS transistors M1, M3 and M7 form a linear current mirror. Similarly, PMOS transistors M2, M4 and M8 form another linear current mirror. PMOS transistor M3 is a current bias through M1 for the Play_op 1021, and PMOS transistor M4 is a current bias through M2 for the Mute_op 1022. The gain of the Mode switch unit 1023 is small, but it may respond to the signal at the terminal Muteplay quickly. When the terminal Muteplay receives a slow ramp signal, the currents in PMOS transistor M3 (controlling M1) and M4 (controlling M2) are correspondingly changed slowly.

From the above, current $I_{M1}$ can be obtained as below:

$$I_{M1} = \frac{(W/L)_{M1}}{(W/L)_{M3}} \cdot I_{M3} \quad (7)$$

Likewise, current $I_{M2}$ can be obtained as below:

$$I_{M2} = \frac{(W/L)_{M2}}{(W/L)_{M4}} \cdot I_{M4} \quad (8)$$

The Mode switch unit 1023 further comprises PMOS transistors M5 and M6. The gate of PMOS transistor M5 is coupled to the gate of PMOS transistor M3, and the drain of PMOS transistor M5 is coupled to the gate of PMOS transistor M4. Similarly, the gate of PMOS transistor M6 is coupled to the gate of PMOS transistor M4, and the drain of PMOS transistor M6 is coupled to the gate of PMOS transistor M3.

When the input signal at the terminal Muteplay is much greater than VR2, the PMOS transistor M4 is switched off, which means that the gate voltage of PMOS transistor M4 is less than the threshold voltage of PMOS transistor M4 and the current $I_{M4}$ is equal to zero. In some situations, the current $I_{M4}$ is difficult to switch off completely and the PMOS transistor M5 contributes to switching off the transistor M4 quickly and completely because PMOS transistors M4 and M5 form a positive feedback loop. When the current $I_{M5}$ is equal to zero, the current $I_{M3}$ is equal to current $I_b$ and the gate voltage of PMOS transistor M3 is a lower voltage; this may pull up the drain voltage of PMOS transistor M5 to VDD. Then, the PMOS transistor M4 is completely switched off. Similarly, the PMOS transistor M3 may be completely switched off by PMOS transistor M6 when PMOS transistor M4 is switched on.

The Play_op 1021 is a two-stage opamp. The first stage comprises PMOS transistors M1, M10, M16, and NMOS transistors M19, M20. The second stage comprises PMOS transistor M7 and NMOS transistor M9. PMOS transistors M10, M16 form a differential pair, with the gate of PMOS transistor M10 coupled to the terminal VREF to receive the voltage reference VR1, and the gate of PMOS transistor M16 coupled to terminal Viin to receive the analog signal output by pre-amplifier 101. The drain of PMOS transistor M7 is coupled to the drain of NMOS transistor M9 at the output node (Out) to output the amplified signal.

Similarly, in the Mute_op 1022 the PMOS transistors M11 and M12 form a differential pair. The gate of PMOS transistor M11 is coupled to the gate of PMOS transistor M10 to share a common voltage reference. The gate of PMOS transistor M12 is coupled to the output of Mute_op 1022 at output node Out which is also the output of the integrator. The second stage comprises PMOS transistor M8 and NMOS transistor M9, and the drain of PMOS transistor M8 is coupled to the drain of NMOS transistor M9 at the output node Out.

The integrator further comprises compensating resistor R5 and compensating capacitor C5 to get better frequency response. Also, resistor R5 can be instead implemented as a transistor working in the linear region.

When the input signal of terminal Muteplay is much greater than VR2, the Play_op 1021 works, and Mute_op 1022 is disabled by the current bias. When the class D amplifier is in the un-mute mode, Play_op 1021 works as an error amplifier, the input signal and feedback signal are amplified, and the output of the comparator is modulated. The duty cycle of the signals at PWM_N and PWM_P is varied according to the input signal.

When the input signal of terminal Muteplay is much less than VR2, Mute_op 1022 works, and Play_op 1021 is disabled by the current bias. The Mute_op 1022 works as a buffer to set the output of integrator 102 to voltage VR1 so that the loop gain is approximately equal to 0 dB. So, when integrator 102 outputs a fixed voltage in the mute mode, the feedback loop of the class D amplifier is cut off, which means that the disturbances at the output cannot affect the input of the integrator 102 and the offset caused by pre-amplifier 101 and mismatching of resistors in feedback loop are reduced.

During the transition between Mute_op 1022 being enable and Play_op 1021 being enabled (1.25V<Muteplay<2.8V), the two opamps work together. The audio signal and offsets delivered to the output increase slowly from zero to the final value, which may avoid the pop noise. With the soft transition from mute to un-mute status, the offset caused by the input stage, and mismatching of resistors in the feedback loop may be transferred to the output softly, and no audible pop noise may be generated.

Figure 4C:
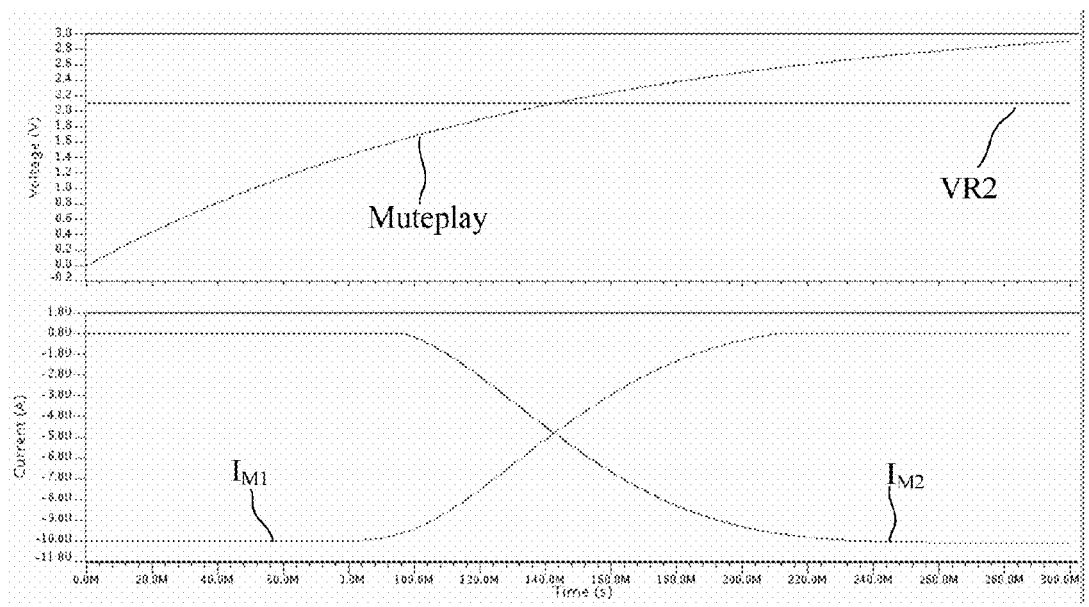
FIG. 4C shows working currents diagram of integrator in accordance with one embodiment.

FIG. 4C shows working currents diagram of integrator in accordance with one embodiment. With the mode switch signal rising slowly, the currents $I_{M1}$ and $I_{M2}$ change smoothly. The voltage signal at terminal Muteplay rises slowly, which means the mode switch signal has a gradually change ratio, then the both currents $I_{M1}$ and $I_{M2}$ have a slow change rate.

Figure 5A:
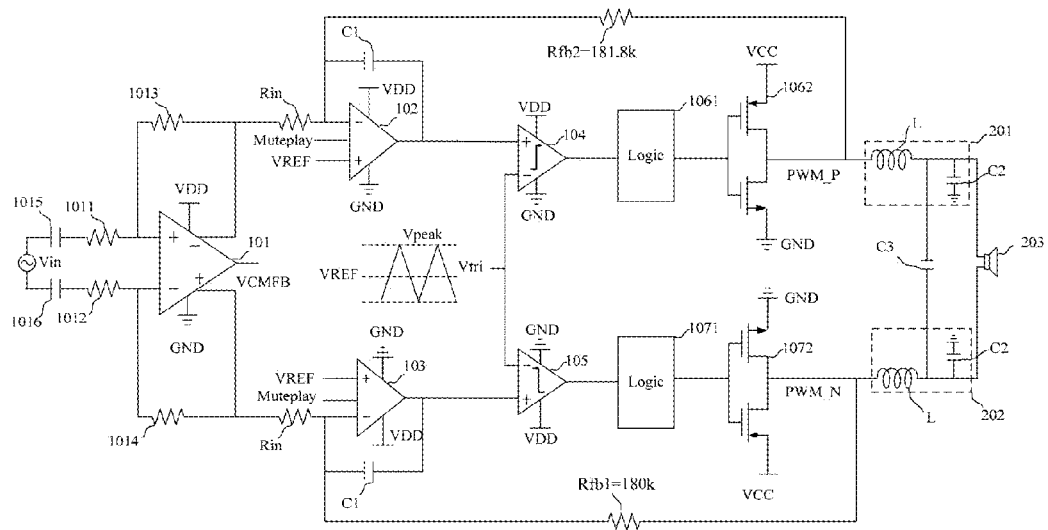
FIG. 5A shows a circuit of the class D amplifier in accordance with another embodiment.
Figure 5B:
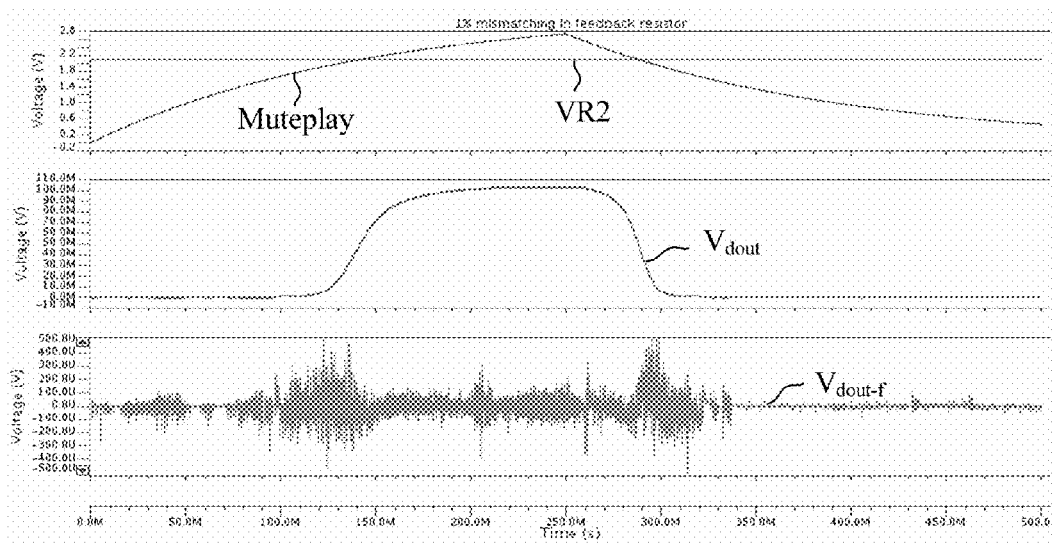
FIG. 5B shows an output diagram of the Class D amplifier in accordance with the embodiment in FIG. 5A.

FIG. 5A shows a circuit of the class D amplifier in accordance with another embodiment. In this embodiment, there is 1% mismatching in the feedback resistor. FIG. 5B shows an output diagram of the Class D amplifier in accordance with the embodiment of the present application in FIG. 5A.

As illustrated in FIG. 5A and FIG. 5B, there is 1% mismatching in the feedback resistor net: $R_{fb1}$=180 k ohm, and $R_{fb2}$=181.8 k ohm. The class D amplifier switches between mute and un-mute status with a slow rate, and the offsets delivered to the output from zero to the normal value or from the normal value to zero change softly when the terminal Muteplay is charged or discharged slowly. The output diagram of the D amplifier is smooth (see curve $V_{dout}$), and after filtered in an A-weighted filter, the BTL output is very small (see curve $V_{dout-f}$), therefore no audible pop noise is generated at these transient events.

Figure 6:
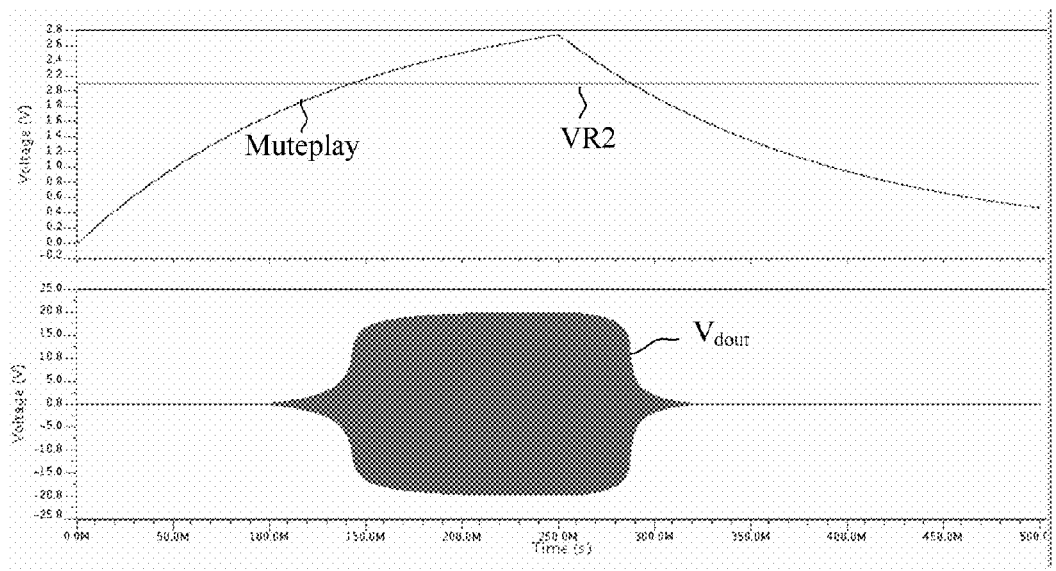
FIG. 6 shows the audio signal diagram under another scenario.

FIG. 6 shows the audio signal diagram under another scenario. The performance of the class D amplifier circuit is illustrated, and pop noise caused by sudden start and finish of the audio signal is reduced. Referring to FIG. 6, curve $V_{dout}$ is an audio signal diagram which is smooth at the beginning or end of the audio signal. The audio signal is amplified to the output from zero to the normal value or from the normal value to zero softly when terminal Muteplay is charged or discharged slowly. In this case, the sudden start or finish of a big audio signal will not cause listener discomfort.

Figure 7:
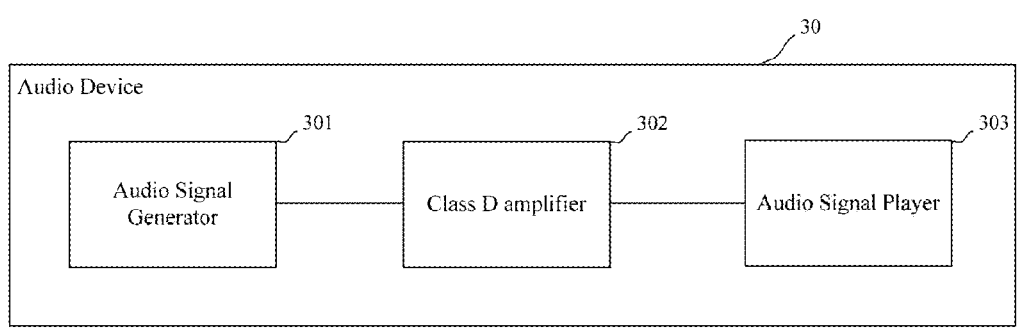
FIG. 7 shows a block diagram of an audio device.

FIG. 7 shows a block diagram of an audio device. The audio device 30 comprises an audio signal generator 301, a class D amplifier 302 as taught herein, and an audio signal player 303. The audio signal generator 301 coupled to the input terminal of the class D amplifier 302, is configured to receive or generate an audio signal. When the class D amplifier 302 receives an audio signal, it may raise the power of the audio signal and output the power raised signal to the audio signal player 303. Then, audio signal player 303 can play the audio signal without pop noise. The audio device 30 can include MP3 player, mobile phone, voice box and any type of sound equipment.

In one aspect, a driver circuit comprises an analog signal input unit, an analog signal input unit, configured to receive and amplify a differential analog signal and output an amplified analog signal in a differential pattern; at least two integrators coupled to output terminals of the analog signal input unit respectively, configured to integrate the amplified analog signal; at least two pulse width modulators coupled to an output terminal of a corresponding one of the integrators respectively, configured to generate pulse signals with corresponding pulse width based on an integrated analog signal from the corresponding integrator; wherein each integrator comprises a first amplifier having a positive input terminal, a negative input terminal and an output terminal, wherein the negative input terminal coupled to the output terminal via a capacitor is configured to receive the amplified analog signal, and the positive input terminal is configured to receive a first reference signal; a regulator coupled to the output terminal of the first amplifier is configured to limit output at the output terminal of the first amplifier to the first reference signal; a control module coupled to the first amplifier and the regulator, configured to control operations of the first amplifier and the regulator based on a mode switch signal, wherein when the mode switch signal is at a mute state, the control module is configured to disable the first amplifier and enable the regulator to have the first reference signal as the output at the output terminal of the first amplifier, when the mode switch signal is at an un-mute state, the control module is configured to gradually change the output at the output terminal of the first amplifier from the first reference signal to an analog signal amplified by the first amplifier.

In an embodiment, the regulator is a second amplifier having a positive input terminal coupled to the first reference signal, a negative input terminal coupled to the output terminal of the first amplifier, and an output terminal coupled to the output terminal of the first amplifier.

In an embodiment, the first amplifier comprises a first load stage, and a first current source coupled to the control module to provide the first amplifier with a first working current; the second amplifier comprises a second load stage, and a second current source coupled to the control module to provide the first amplifier with a second working current.

In an embodiment, the first current source comprises a first PMOS transistor having a gate coupled to the control module; the second current source comprises a second PMOS transistor having a gate coupled to the control module; wherein the current values of the first and second current source are determined by the control module.

In some embodiments of the present invention, the integrator comprises a first amplifier having a first positive input terminal, a first negative input terminal and a first output terminal, wherein the first negative input terminal is configured to receive the amplified analog signal and is coupled to the first output terminal via a capacitor, the first positive input terminal is configured to receive the first reference signal; a regulator coupled to the first output terminal is configured to limit output at the first output terminal to the first reference signal; a control module coupled to the first amplifier and the regulator, configured to control operations of the first amplifier and the regulator based on the mode switch signal, wherein when the mode switch signal is at a mute state, the control module is configured to disable the first amplifier and enable the regulator to have the first reference signal as the output at the first output terminal, when the mode switch signal is at an un-mute state, the control module is configured to gradually change the output at the first output terminal from the first reference signal to the input signal amplified by the first amplifier.

In an embodiment, the control module is a third amplifier and comprises: a mode switch signal input stage comprising a differential pair, is configured to receive the mode switch signal; a first output stage having a third PMOS transistor, both gate and drain of the third PMOS transistor are coupled to the gate of the first PMOS transistor; a second output stage having a fourth PMOS transistor, both gate and drain of the fourth PMOS transistor are coupled to the gate of the second PMOS transistor.

In an embodiment, the control module further comprises a fifth PMOS transistor, gate of the fifth PMOS transistor is coupled to the gate of the third PMOS transistor, and the drain of the fifth PMOS transistor is coupled to the drain of the transistor; and a sixth PMOS transistor, the gate of the transistor M6 is coupled to the gate of the fourth PMOS transistor, and the drain of the sixth PMOS transistor is coupled to the drain of the third PMOS transistor.

In an embodiment, the class D amplifier further comprises: at least one mode switch signal generator coupled to the integrator, configured to convert a step Enable signal into the mode switch signal with a gradually change ratio. Therefore, the mode switch signal may be a smoothly varied signal, which contributes to reduce the pop noise.

In an embodiment, the first current source comprises a transistor having a gate coupled to the control module; the second current source comprises a transistor having a gate coupled to the control module; wherein the current values of the first and second current source are determined by the control module output.

In an embodiment, the control module is a third amplifier and comprises a mode switch signal input stage comprising a differential pair comprising a transistor, configured to receive the mode switch signal; a first output stage having a transistor, both the gate and drain of the transistor are coupled to the gate of the transistor; a second output stage having a transistor, both the gate and drain of the transistor are coupled to the gate of the transistor.

In some embodiments, the class D amplifier further comprises at least two power units coupled to output terminals of a corresponding one of the pulse width modulators respectively, and configured to raise power of the pulse signals, wherein output terminals of the power units are coupled to the input terminals of the integrator via a resistor feedback net, wherein the resistor feedback net comprises at least one resistor.

In some embodiments, the class D amplifier further comprises an output unit coupled to the output terminals of the power units respectively, configured to convert the pulse signals to analog signals.

In some embodiments, each pulse width modulator comprises: a comparator having a positive input terminal coupled to the output terminal of the integrator, a negative input terminal coupled to a triangle signal, and an output terminal configured to output the pulse signals, wherein intermediate level of the triangle signal is equal to the first voltage reference.

In some embodiments, each power unit comprises: a logic unit coupled to the output terminal of the comparator; a power amplifier coupled to output of the logic unit, configured to raise the pulse signals power; wherein the logic unit is configured to shift voltage level of the pulse signals output by the pulse width modulators to be able to drive the power amplifier.

In another aspect, a first amplifier having a positive input terminal, a negative input terminal and an output terminal, wherein the negative input terminal is configured to receive the amplified analog signal and is coupled to the output terminal via a capacitor, the positive input terminal is configured to receive a first reference signal; a regulator coupled to the output terminal of the first amplifier is configured to limit output at the output terminal of the first amplifier to the first reference signal; a control module coupled to the first amplifier and the regulator, configured to control operations of the first amplifier and the regulator based on a mode switch signal, wherein when the mode switch signal is at a mute state, the control module is configured to disable the first amplifier and enable the regulator to have the first reference signal as the output at the output terminal of the first amplifier, when the mode switch signal is at an un-mute state, the control module is configured to gradually change the output at the output terminal of the first amplifier from the first reference signal to an analog signal amplified by the first amplifier.

In an embodiment, the regulator is a second amplifier having a positive input terminal coupled to the first reference signal, a negative input terminal coupled to the output terminal of the first amplifier, and an output terminal coupled to the output terminal of the first amplifier; the control module is a third amplifier, and is configured to receive the mode switch signal to change working currents of the regulator and the first amplifier based on the mode switch signal.

In another aspect, an audio device adopting the class D amplifier, wherein the class D amplifier comprises at least two integrators, wherein each integrator comprises a first amplifier having a positive input terminal, a negative input terminal and an output terminal, wherein the negative input terminal coupled to the output terminal via a capacitor is configured to receive the amplified analog signal, and the positive input terminal is configured to receive a first reference signal; a regulator coupled to the output terminal of the first amplifier is configured to limit output at the output terminal of the first amplifier to the first reference signal; a control module coupled to the first amplifier and the regulator, configured to control operations of the first amplifier and the regulator based on a mode switch signal, wherein when the mode switch signal is at a mute state, the control module is configured to disable the first amplifier and enable the regulator to have the first reference signal as the output at the output terminal of the first amplifier, when the mode switch signal is at an un-mute state, the control module is configured to gradually change the output at the output terminal of the first amplifier from the first reference signal to an analog signal amplified by the first amplifier.

In another aspect, a method of reducing pop noise in an audio device, comprising: receiving, by the class D amplifier of the audio device, a differential analog input signal; amplifying, by the class D amplifier of the audio device, the differential analog signal and outputting an amplified analog signal in a differential pattern; responsive to a mode switch signal, integrating, by the class D amplifier of the audio device, the amplified analog signal in un-mute mode, and limiting, by the class D amplifier of the audio device, the analog input signal to a fixed voltage signal in mute mode; generating, by the class D amplifier of the audio device, pulse-width-modulated signals responsive to the integrated signals; and converting, by the class D amplifier of the audio device, the pulse-width-modulated signals into analog signals.

In an embodiment, gradually integrating, by the class D amplifier of the audio device, the amplified analog signal from the fixed voltage signal to the integrated signal when the mode switch signal switches from mute to un-mute mode; or gradually limiting, by the class D amplifier of the audio device, the analog signal from the integrated signal to the fixed voltage signal when the mode switch signal switches from un-mute to mute mode.

Compared with the conventional circuits, the class D amplifier can significantly reduce the pop noise as below: (1) caused by the offset of both feedback resistors and pre-amplifier; and (2) caused by a sudden start or finish of a big audio signal.

It may be readily understood by those skilled in the art that circuits and methods may be varied while remaining within the scope of the present invention. It is also appreciated that the present invention provides many applicable inventive concepts other than the specific contexts used to illustrate embodiments. Therefore, although certain example methods, circuits and devices have been described herein, the scope of coverage of this patent is not limited thereto. On the contrary, this patent covers all methods, circuits, and devices fairly falling within the scope of the appended claims either literally or under the doctrine of equivalents.

What is claimed is:

1. A circuit, comprising:
    a first amplifier having first and second inputs coupled to a first differential input stage biased by a first current source and having a first output;
    a second amplifier having first and second inputs coupled to a second differential input stage biased by a second current source and having a second output,
    wherein the first inputs of the first and second differential input stages are both coupled to receive a same reference voltage,
    wherein the second input of the first amplifier is configured to receive an input signal, and
    wherein the second input of the second amplifier is configured to receive an output signal; and
    a bias control circuit comprising a third amplifier having first and second inputs coupled to a third differential input stage and biased by a third current source, said bias control circuit further having a first output configured to control the first current source and a second output configured to control the second current source.

2. The circuit of claim 1, further comprising a common load circuit shared by the first and second differential input stages.

3. The circuit of claim 2, wherein the first and second outputs are a common output node of said common load circuit.

4. The circuit of claim 3, further comprising an output stage configured to generate said output signal including:
    a first transistor having a gate terminal coupled to the common output node, a source terminal coupled to a first supply node and a drain terminal coupled to a circuit output node;
    a second transistor having a gate terminal coupled to the first output of the bias control circuit, a source terminal coupled to a second supply node and a drain terminal coupled to the circuit output node; and
    a third transistor having a gate terminal coupled to the second output of the bias control circuit, a source terminal coupled to the second supply node and a drain terminal coupled to the circuit output node.

5. The circuit of claim 4, further comprising a compensation capacitor coupled between the gate terminal and drain terminal of the first transistor.

6. The circuit of claim 1, wherein the first and second outputs are a common circuit output, and further comprising:
    a capacitor having a first terminal coupled to the common circuit output and a second terminal coupled to the second input of the first differential input stage; and
    a direct electrical connection of the output signal to the second input of the second differential input stage.

7. The circuit of claim 6, wherein the first input of the third differential input stage is configured to receive a ramp signal and the second input of the third differential input stage is configured to receive a further reference voltage.

8. The circuit of claim 1, further comprising a load circuit coupled to the third differential input stage, said load circuit comprising:
    a fourth transistor having a gate terminal coupled to the first output of the bias control circuit, a source terminal coupled to a second supply node and a drain terminal coupled a first node of the third differential input stage and the gate terminal of the fourth transistor; and
    a fifth transistor having a gate terminal coupled to the second output of the bias control circuit, a source terminal coupled to the second supply node and a drain terminal coupled a second node of the third differential input stage and the gate terminal of the fifth transistor.

9. The circuit of claim 8, wherein the load circuit further comprises:
a sixth transistor having a gate terminal coupled to the gate terminal and drain terminal of the fourth transistor, a source terminal coupled to the second supply node and a drain terminal coupled the gate terminal and drain terminal of the fifth transistor; and
a seventh transistor having a gate terminal coupled to the gate terminal and drain terminal of the fifth transistor, a source terminal coupled to the second supply node and a drain terminal coupled the gate terminal and drain terminal of the fourth transistor.

10. The circuit of claim 1, further comprising:
a first current mirror circuit having an input coupled a first node of the third differential input stage and an output provided by said first current source; and
a second current mirror circuit having an input coupled to a second node of the third differential input stage and an output provided by said second current source.

11. A circuit, comprising:
a first amplifier having first and second inputs coupled to a first differential input stage biased by a first current source and having a first output;
a second amplifier having first and second inputs coupled to a second differential input stage biased by a second current source and having a second output; and
a bias control circuit comprising a third amplifier having first and second inputs coupled to a third differential input stage and biased by a third current source, said bias control circuit further having a first output configured to control the first current source and a second output configured to control the second current source;
wherein the first amplifier operates as an integrating amplifier and the second amplifier operates as a buffer amplifier.

12. The circuit of claim 11, wherein the first and second outputs are a common output and wherein the bias control circuit operates in response to a change in logic state of a control signal to gradually enable the integrating amplifier while simultaneously gradually disabling the buffer amplifier.

13. The circuit of claim 11, wherein the first and second outputs are a common output and wherein the bias control circuit operates in response to a change in logic state of a control signal to gradually disable the integrating amplifier while simultaneously gradually enabling the buffer amplifier.

14. The circuit of claim 11, further comprising a common load circuit shared by the first and second differential input stages.

15. The circuit of claim 14, wherein the first and second outputs are a common output of said common load circuit.

16. The circuit of claim 15, further comprising an output stage including:
a first transistor having a gate terminal coupled to the common output node, a source terminal coupled to a first supply node and a drain terminal coupled to circuit output node;
a second transistor having a gate terminal coupled to the first output of the bias control circuit, a source terminal coupled to a second supply node and a drain terminal coupled to the circuit output node; and
a third transistor having a gate terminal coupled to the second output of the bias control circuit, a source terminal coupled to the second supply node and a drain terminal coupled to the circuit output node.

17. The circuit of claim 16, further comprising a compensation capacitor coupled between the gate terminal and drain terminal of the first transistor.

18. The circuit of claim 11, wherein the first and second outputs are a common circuit output, and further comprising:
a capacitor having a first terminal coupled to the common circuit output and a second terminal coupled to the second input of the first differential input stage; and
a direct electrical connection of the common circuit output to the second input of the second differential input stage.

19. The circuit of claim 18, wherein the first input of the third differential input stage is configured to receive a ramp signal and the second input of the third differential input stage is configured to receive a reference voltage.

20. The circuit of claim 11, further comprising a load circuit coupled to the third differential input stage, said load circuit comprising:
a fourth transistor having a gate terminal coupled to the first output of the bias control circuit, a source terminal coupled to a second supply node and a drain terminal coupled a first node of the third differential input stage and the gate terminal of the fourth transistor; and
a fifth transistor having a gate terminal coupled to the second output of the bias control circuit, a source terminal coupled to the second supply node and a drain terminal coupled a second node of the third differential input stage and the gate terminal of the fifth transistor.

21. The circuit of claim 20, wherein the load circuit further comprises:
a sixth transistor having a gate terminal coupled to the gate terminal and drain terminal of the fourth transistor, a source terminal coupled to the second supply node and a drain terminal coupled the gate terminal and drain terminal of the fifth transistor; and
a seventh transistor having a gate terminal coupled to the gate terminal and drain terminal of the fifth transistor, a source terminal coupled to the second supply node and a drain terminal coupled the gate terminal and drain terminal of the fourth transistor.

22. The circuit of claim 11, further comprising:
a first current mirror circuit having an input coupled a first node of the third differential input stage and an output provided by said first current source; and
a second current mirror circuit having an input coupled to a second node of the third differential input stage and an output provided by said second current source.

23. A circuit, comprising:
a first amplifier having first and second inputs coupled to a first differential input stage biased by a first current source and having a first output;
a second amplifier having first and second inputs coupled to a second differential input stage biased by a second current source and having a second output; and
a bias control circuit comprising a third amplifier having first and second inputs coupled to a third differential input stage and biased by a third current source, said bias control circuit further having a first output configured to control the first current source and a second output configured to control the second current source;
wherein the first and second outputs are a common circuit output;

a capacitor having a first terminal coupled to the common circuit output and a second terminal coupled to the second input of the first differential input stage; and a direct electrical connection of the common circuit output to the second input of the second differential input stage.

24. The circuit of claim 23, further comprising a common load circuit shared by the first and second differential input stages.

25. The circuit of claim 24, wherein the first and second outputs are a common output of said common load circuit.

26. The circuit of claim 25, further comprising an output stage including:
- a first transistor having a gate terminal coupled to the common output node, a source terminal coupled to a first supply node and a drain terminal coupled to circuit output node;
- a second transistor having a gate terminal coupled to the first output of the bias control circuit, a source terminal coupled to a second supply node and a drain terminal coupled to the circuit output node; and
- a third transistor having a gate terminal coupled to the second output of the bias control circuit, a source terminal coupled to the second supply node and a drain terminal coupled to the circuit output node.

27. The circuit of claim 26, further comprising a compensation capacitor coupled between the gate terminal and drain terminal of the first transistor.

28. The circuit of claim 23, wherein the first input of the third differential input stage is configured to receive a ramp signal and the second input of the third differential input stage is configured to receive a reference voltage.

29. The circuit of claim 23, further comprising a load circuit coupled to the third differential input stage, said load circuit comprising:
- a fourth transistor having a gate terminal coupled to the first output of the bias control circuit, a source terminal coupled to a second supply node and a drain terminal coupled a first node of the third differential input stage and the gate terminal of the fourth transistor; and
- a fifth transistor having a gate terminal coupled to the second output of the bias control circuit, a source terminal coupled to the second supply node and a drain terminal coupled a second node of the third differential input stage and the gate terminal of the fifth transistor.

30. The circuit of claim 29, wherein the load circuit further comprises:
- a sixth transistor having a gate terminal coupled to the gate terminal and drain terminal of the fourth transistor, a source terminal coupled to the second supply node and a drain terminal coupled the gate terminal and drain terminal of the fifth transistor; and
- a seventh transistor having a gate terminal coupled to the gate terminal and drain terminal of the fifth transistor, a source terminal coupled to the second supply node and a drain terminal coupled the gate terminal and drain terminal of the fourth transistor.

31. The circuit of claim 23, further comprising:
- a first current mirror circuit having an input coupled a first node of the third differential input stage and an output provided by said first current source; and
- a second current mirror circuit having an input coupled to a second node of the third differential input stage and an output provided by said second current source.

* * * * *